United States Patent
Kuboki et al.

(10) Patent No.: US 12,249,732 B2
(45) Date of Patent: Mar. 11, 2025

(54) WIRING MODULE AND POWER STORAGE MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Hideyuki Kuboki, Mie (JP); Hiroomi Hiramitsu, Mie (JP); Xueqing Dong, Mie (JP); Masato Tsutsuki, Mie (JP); Yuto Sato, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 594 days.

(21) Appl. No.: 17/620,234

(22) PCT Filed: Jun. 12, 2020

(86) PCT No.: PCT/JP2020/023210
§ 371 (c)(1),
(2) Date: Dec. 17, 2021

(87) PCT Pub. No.: WO2020/255876
PCT Pub. Date: Dec. 24, 2020

(65) Prior Publication Data
US 2022/0328925 A1    Oct. 13, 2022

(30) Foreign Application Priority Data
Jun. 18, 2019    (JP) ............................... 2019-112789

(51) Int. Cl.
*H01M 50/298*    (2021.01)
*H01M 50/249*    (2021.01)
(Continued)

(52) U.S. Cl.
CPC ....... *H01M 50/298* (2021.01); *H01M 50/249* (2021.01); *H01M 50/284* (2021.01);
(Continued)

(58) Field of Classification Search
CPC ............. H01M 50/298; H01M 50/249; H01M 50/284; H01M 50/507; H01M 50/516;
(Continued)

(56) References Cited

U.S. PATENT DOCUMENTS

2010/0271036 A1*  10/2010  Kishimoto ............ H01M 50/51
                                                    324/434
2012/0231638 A1    9/2012  Ikeda et al.
(Continued)

FOREIGN PATENT DOCUMENTS

JP    2001-345082    12/2001
JP    2011-228216    11/2011
(Continued)

OTHER PUBLICATIONS

International Search Report issued in International Bureau of WIPO Patent Application No. PCT/JP2020/023210, dated Sep. 8, 2020, along with an English translation thereof.

*Primary Examiner* — Lisa S Park
(74) *Attorney, Agent, or Firm* — Greenblum & Bernstein, P.L.C.

(57) ABSTRACT

A wiring module is configured to attach to a power storage element group of an arranged plurality of power storage elements, each one of the power storage elements including an electrode terminal, including a bus bar that connects to the electrode terminal; a circuit board on which a conductive (Continued)

path is formed; and a relay member that connects the bus bar and the circuit board, wherein the relay member includes a bus bar connection portion that connects to the bus bar and a board connection portion that connects to the conductive path of the circuit board, the relay member includes a connection portion with a plate-like shape that joins the bus bar connection portion and the board connection portion and extends in a direction intersecting an arrangement direction of the plurality of power storage elements, and the connection portion includes a first deformation portion capable of deforming in the arrangement direction.

10 Claims, 11 Drawing Sheets

(51) Int. Cl.
*H01M 50/284* (2021.01)
*H01M 50/507* (2021.01)
*H01M 50/516* (2021.01)
*H05K 1/18* (2006.01)

(52) U.S. Cl.
CPC ....... *H01M 50/507* (2021.01); *H01M 50/516* (2021.01); *H05K 1/189* (2013.01)

(58) Field of Classification Search
CPC ........... H01M 50/209; H01M 2220/20; H01M 50/503; H01M 50/519; H05K 1/189; H05K 3/3405; H05K 2201/09236; H05K 2201/10037; H05K 2201/1034; H05K 2201/2009; H01G 11/78; H01G 2/04; H01G 11/76; H01G 11/82; H01G 11/10; Y02E 60/10
See application file for complete search history.

(56) References Cited

U.S. PATENT DOCUMENTS

| | | | |
|---|---|---|---|
| 2016/0197333 A1* | 7/2016 | DeKeuster | H01M 10/0525 429/7 |
| 2019/0389318 A1* | 12/2019 | Lee | H01M 50/516 |

FOREIGN PATENT DOCUMENTS

| | | |
|---|---|---|
| JP | 2015-022965 | 2/2015 |
| JP | 2015-049931 | 3/2015 |
| JP | 2015-138604 | 7/2015 |

* cited by examiner

WIRING MODULE AND POWER STORAGE MODULE

TECHNICAL FIELD

The present disclosure relates to a wiring module and a power storage module.

BACKGROUND ART

A known power supply device (JP 2001-345082A) includes a battery holder for storing a plurality of module batteries; bus bars for connecting the module batteries connected to electrode terminals of the module batteries stored in the battery holder; an end plate, which is an insulator for holding the plurality of bus bars in position; and a printed circuit board fixed on a surface of the end plate and provided with a signal output line connected to the module batteries for outputting, to the outside, a voltage of the module batteries. The bus bars and the printed circuit board are connected via connection terminals.

CITATION LIST

Patent Documents

Patent Document 1; JP 2001-345082A

SUMMARY OF INVENTION

Technical Problem

The power storage elements forming the plurality of module batteries may expand when charging and contract when discharging, for example. In such cases, the bus bars connected to the electrode terminals of the module batteries and the printed circuit board may become offset from one another in the arrangement direction of the plurality of module batteries. This causes a force to act on the connection terminals connecting the bus bars and the printed circuit board, which may cause a reduction in the electrical connection reliability between the bus bars and the connection terminals or a reduction in the electrical connection reliability between the connection terminals and the printed circuit board.

The present disclosure has been made in light of the foregoing circumstance and is directed at providing technology including a wiring module with enhanced electrical connection reliability.

Solution to Problem

A wiring module according to the present disclosure is configured to attach to a power storage element group of an arranged plurality of power storage elements, each one of the power storage elements including an electrode terminal and includes: a bus bar that connects to the electrode terminal; a circuit board on which a conductive path is formed; and a relay member that connects the bus bar and the circuit board, wherein the relay member includes a bus bar connection portion that connects to the bus bar and a board connection portion that connects to the conductive path of the circuit board, the relay member includes a connection portion with a plate-like shape that joins the bus bar connection portion and the board connection portion and extends in a direction intersecting an arrangement direction of the plurality of power storage elements, and the connection portion includes a first deformation portion capable of deforming in the arrangement direction, and a plate surface of the first deformation portion intersects the arrangement direction.

Advantageous Effects of Invention

According to the present disclosure, the electrical connection reliability of a wiring module can be enhanced.

DESCRIPTION OF EMBODIMENTS

Figure 1:
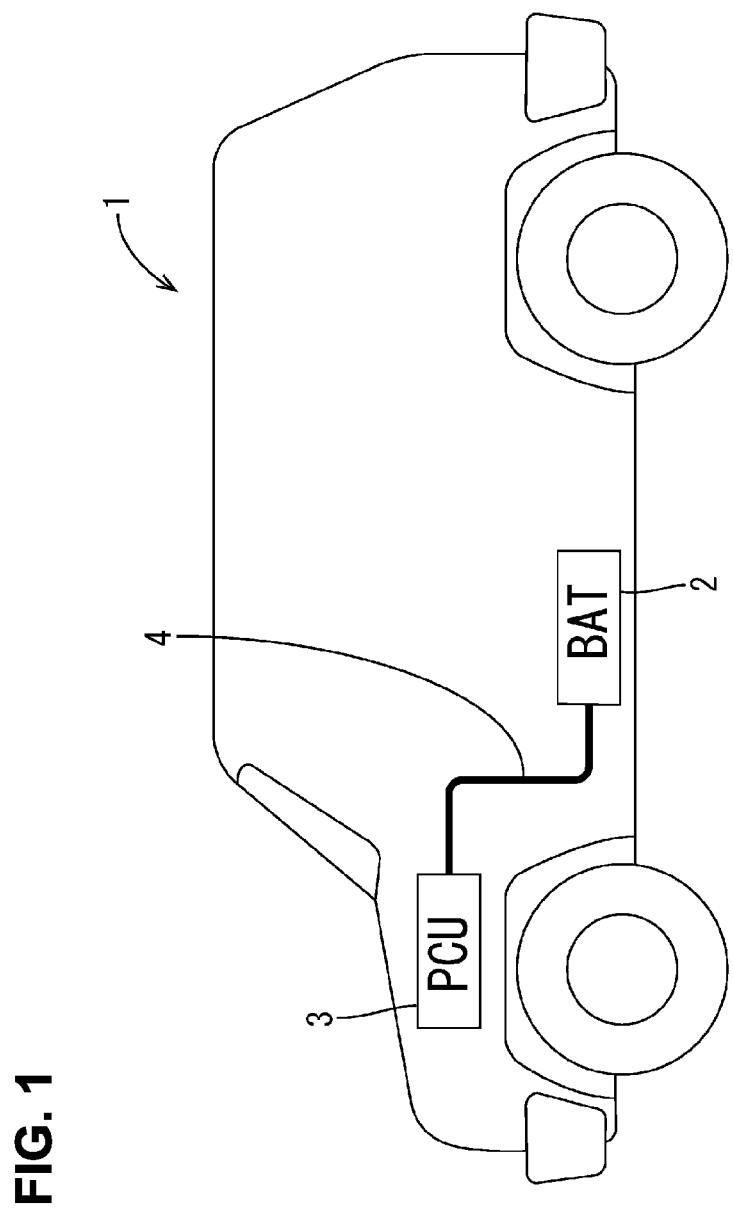
FIG. 1 is a schematic diagram illustrating a vehicle in which a power storage module according to a first embodiment is installed.

Description of Embodiments of the Present Disclosure

Firstly, embodiments of the present disclosure will be listed and described.

1. A wiring module according to the present disclosure is configured to attach to a power storage element group of an arranged plurality of power storage elements, each one of the power storage elements including an electrode terminal and includes: a bus bar that connects to the electrode terminal; a circuit board on which a conductive path is formed; and a relay member that connects the bus bar and the circuit board, wherein the relay member includes a bus bar connection portion that connects to the bus bar and a board connection portion that connects to the conductive path of the circuit board, the relay member includes a connection portion with a plate-like shape that joins the bus bar connection portion and the board connection portion and extends in a direction intersecting an arrangement direction of the plurality of power storage elements, and the connection portion includes a first deformation portion capable of deforming in the arrangement direction, and a plate surface of the first deformation portion intersects the arrangement direction.

According to the configuration described above, in a case where the bus bar connected to the electrode terminal of the power storage elements and the circuit board are misaligned in the arrangement direction of the plurality of power storage elements, the first deformation portion deforms, thus minimizing or preventing a load acting on the connection portion between the bus bar and the bus bar connection portion and the connection portion between the conductive path and the board connection portion. In this manner, the electrical connection reliability between the bus bars and the circuit board can be enhanced.

In a case where a relatively easy-to-deform portion, such as the first deformation portion, is formed in the connection portion, the strength of the connection portion may be reduced. This may lead to the connection portion deforming at an unexpected time or in an unexpected direction as a result of a collision with a foreign object, for example. In light of this, the present disclosure has a configuration in which the plate surface of the first deformation portion intersects the arrangement direction of the plurality of power storage elements. In this manner, the first deformation portion is resistant to deformation in a direction intersecting the arrangement direction of the plurality of power storage elements. This minimizes or prevents unexpected deformation in the connection portion.

2. The connection portion preferably includes a plurality of the first deformation portions.

By the connection portion including a plurality of first deformation portions, the strength of the connection portion can be enhanced compared to a configuration in which the connection portion includes a single first deformation portion. As a result, adjustment of how easily the connection portion deforms and the strength can be easily performed by adjusting the number of the first deformation portions formed in the connection portion.

3. A first bend portion is preferably formed at the first deformation portion, the first bend portion bending outward or inward in a direction intersecting the plate surface of the first deformation portion.

According to the configuration described above, by forming the first bend portion at the first deformation portion, the first deformation portion easily deforms at the first bend portion. Thus, in a case where the bus bar connected to the electrode terminal of the power storage element and the conductive path of the circuit board are misaligned in the arrangement direction of the plurality of power storage elements, the first deformation portion can easily deform. Accordingly, a load acting on the connection portion between the bus bar and the bus bar connection portion and a connection portion between the conductive path and the board connection portion can be minimized or prevented. This allows the electrical connection reliability between the bus bars and the circuit board to be further enhanced.

4. The connection portion preferably further includes a second deformation portion capable of deforming in a direction intersecting the arrangement direction.

In a case where the second deformation portion deforms in a direction intersecting the arrangement direction of the plurality of power storage elements, misaligning the bus bar connected to the electrode terminal of the power storage element and the conductive path of the circuit board in a direction intersecting the arrangement direction of the plurality of power storage elements, a load acting on the connection portion between the bus bar and the bus bar connection portion and the connection portion between the conductive path and the board connection portion is minimized or prevented. In this manner, the electrical connection reliability between the bus bars and the circuit board can be enhanced.

5. A second bend portion is preferably formed at the second deformation portion, the second bend portion bending outward or inward in a direction intersecting the plate surface of the second deformation portion.

According to the configuration described above, by forming the second bend portion at the second deformation portion, the second deformation portion easily deforms at the second bend portion. Thus, in a case where the bus bar connected to the electrode terminal of the power storage element and the conductive path of the circuit board are misaligned in a direction intersecting the arrangement direction of the plurality of power storage elements, the second deformation portion can easily deform. Accordingly, a load acting on the connection portion between the bus bar and the bus bar connection portion and a connection portion between the conductive path and the board connection portion can be minimized or prevented. This allows the electrical connection reliability between the bus bars and the circuit board to be further enhanced.

6. The bus bar preferably includes aluminum, the relay member preferably includes nickel, and the bus bar and the relay member are preferably welded together.

In a case where the bus bars are formed by a material including aluminum, depending on the material of the relay members, welding together the bus bars and the relay members may form a relatively brittle alloy at the interface portion between the bus bars and the relay members. According to the present disclosure, the relay members are made of a material including nickel, and the bus bars are made of a material including aluminum. Thus, a highly stable alloy is formed between the bus bar connection portion of the relay member and the bus bar, allowing the bus bar and the relay member to be strongly welded together.

7. The conductive path preferably includes copper, the relay member preferably includes a metal surface plated with nickel or tin, and the conductive path and the relay member are preferably soldered together.

The metal material obtained by plating the copper or aluminum metal surface with nickel or tin has good wettability with the solder in a molten state, allowing a strong connection to be formed between the conductive path of the circuit board and the board connection portion of the relay member.

8. The circuit board is preferably a flexible printed circuit.

According to the present disclosure, because the circuit board is a flexible printed circuit, the wiring density can be enhanced compared to a configuration in which a circuit for detecting the voltage of the power storage elements are formed by a plurality of electrical wires. This allows the size of the wiring module is be reduced.

9. The wiring module is preferably for a vehicle and is preferably used installed in a vehicle.

10. A power storage module according to the present disclosure includes the wiring module according to any one of 1 to 9 described above; and a power storage element group of an arranged plurality of power storage elements, each one of the plurality of power storage elements including an electrode terminal, wherein the conductive path and the board connection portion are soldered together, and the electrode terminal and the bus bar connection portion are welded together.

DETAILED DESCRIPTION OF EMBODIMENTS

Embodiments of the present disclosure will be described below. The present invention is not limited to these examples and is defined by the scope of the claims, and all modifications that are equivalent to or within the scope of the claims are included.

First Embodiment

The first embodiment in which a power storage pack 2 to which the present disclosure is applied is installed in a vehicle 1 will be described with reference to FIGS. 1 to 7. The power storage pack 2 is installed in the vehicle 1, which may be an electric vehicle, a hybrid vehicle, or the like, and used as the drive source of the vehicle 1. Hereinafter, for members including a plurality of members, a reference sign or number may only be given to one or more of the members of the plurality and not given to other members.

Overall Configuration

As illustrated in FIG. 1, the power storage pack 2 is arranged in the central region of the vehicle 1. A power control unit (PCU) 3 is arranged in the front portion of the vehicle 1. The power storage pack 2 and the PCU 3 are connected by a wire harness 4. The power storage pack 2 and the wire harness 4 are connected by a non-illustrated connector. The power storage pack 2 includes a power storage module 10 provided with a plurality of power storage elements 11.

Power Storage Elements 11

The power storage elements 11 (an example of objects) are shaped like a rectangular parallelepiped with a flat shape in the front-and-back direction. An upward-projecting electrode terminal 13 is formed on the upper surface of each power storage element 11 on the left end portion and the right end portion. One of the two electrode terminals 13 formed on a single power storage element 11 is the positive electrode and the other is the negative electrode. The plurality of power storage elements 11 arranged in the front-and-back direction (an example of an arrangement direction) form a power storage element group 12.

Wiring Module 20

Figure 2:
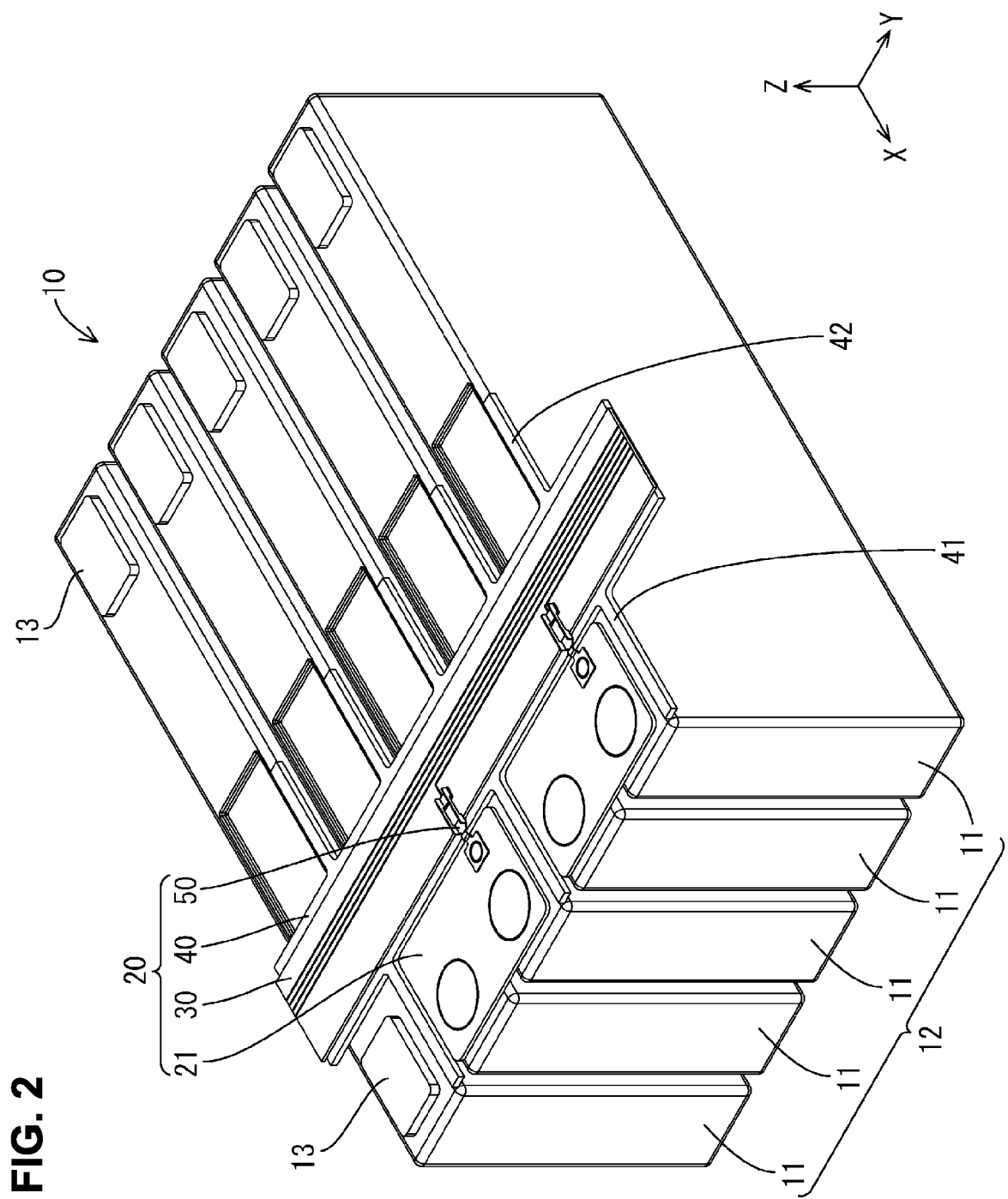
FIG. 2 is a perspective view illustrating the power storage module according to the first embodiment.

A wiring module 20 is arranged at a portion of the upper surface of the power storage element group 12 at or near the left end portion and at or near the right end portion. In FIG. 2, the wiring module 20 arranged on the left end portion side of the plurality of power storage elements 11 is omitted.

The wiring module 20 is provided with a plurality of bus bars 21 and a circuit board 30. A reinforcement plate 40 made of a synthetic resin with insulating properties is arranged below the circuit board 30.

Bus Bars 21

As illustrated in FIG. 2, the bus bars 21 are formed by pressing a metal plate material into a predetermined shape. The metal constituting the bus bars 21 may be an appropriately selected discretionary metal, such as copper, a copper alloy, aluminum, an aluminum alloy, or the like. In the present embodiment, the bus bars 21 are made of aluminum or an aluminum alloy and includes aluminum. The bus bars 21 have a substantially rectangular shape long in the front-and-back direction as seen from above.

The bus bars 21 are connected to an adjacent pair of electrode terminals 13 of different power storage elements 11. The length dimension in the front-and-back direction of the bus bars 21 is set so that the adjacent electrode terminals 13 are covered from above. The bus bars 21 and the electrode terminals 13 may be connected via laser welding, soldering, or the like, but the method is not particularly limited. In the present embodiment, the bus bars 21 and the electrode terminals 13 are laser welded together. A weld mark 24 with a circular shape as seen from above is formed on the bus bars 21. The shape of the weld mark 24 is not limited and may be linear.

Circuit Board 30

As illustrated in FIG. 2, the circuit board 30 according to the present embodiment is a flexible printed circuit (FPC). The circuit board 30 includes a conductive path 32 formed on the upper surface or the lower surface of a support substrate 35 made of an insulating film via a conductive foil made of metal including copper, with the conductive path 32 being covered by a coverlay layer (not illustrated). The conductive path 32 is formed by patterning a conductive foil formed on the support substrate 35 via known printed circuit technology. As the metal constituting the conductive path 32, a metal including copper, such as copper or a copper alloy, may be used. In the present embodiment, the conductive path 32 is formed by a copper foil.

The support substrate 35 is formed by a film or sheet made of a synthetic resin with insulating properties. As the synthetic resin constituting the support substrate 35, a known synthetic resin, such as polyimide, polyethylene, polyamide, or the like, can be appropriately selected.

A land 34 is formed at the end portion of the conductive path 32. The land 34 forms a portion of the conductive path 32. The land 34 has a quadrangular shape as seen from above. The circuit board 30 is drawn out from the wiring module 20 and connected to a non-illustrated electronic control unit (ECU). The coverlay layer around the land 34 is peeled back, exposing the land 34 from the coverlay layer.

Reinforcement Plate 40

As illustrated in FIG. 2, the reinforcement plate 40 has a shape elongated in the front-and-back direction. The width dimension in the left-and-right direction of the reinforcement plate 40 is greater than the width dimension in the left-and-right direction of the circuit board 30. The circuit board 30 is installed on the upper surface of the reinforcement plate 40. How the reinforcement plate 40 and the circuit board 30 are fixed together is not particularly limited, and, for example, they may be bonded together via an adhesive, fixed together via a separate member such as a screw or clip, or fixed together via thermal welding.

A plurality of right-projecting spaced portions 41 are formed at intervals at the right side edge of the reinforcement plate 40. The spaced portions 41 are arranged in front of and behind the bus bars 21, when the bus bars 21 are connected to the circuit board 30. In this manner, adjacent pairs of the bus bars 21 in the front-and-back direction are separated by the spaced portions 41.

A plurality of left-projecting projection portions 42 are formed at intervals in the front-and-back direction at the left side edge of the reinforcement plate 40.

When the wiring module 20 is attached to the plurality of power storage elements 11, the projection portions 42 are arranged between adjacent power storage elements 11.

Relay Member 50

Figure 3:
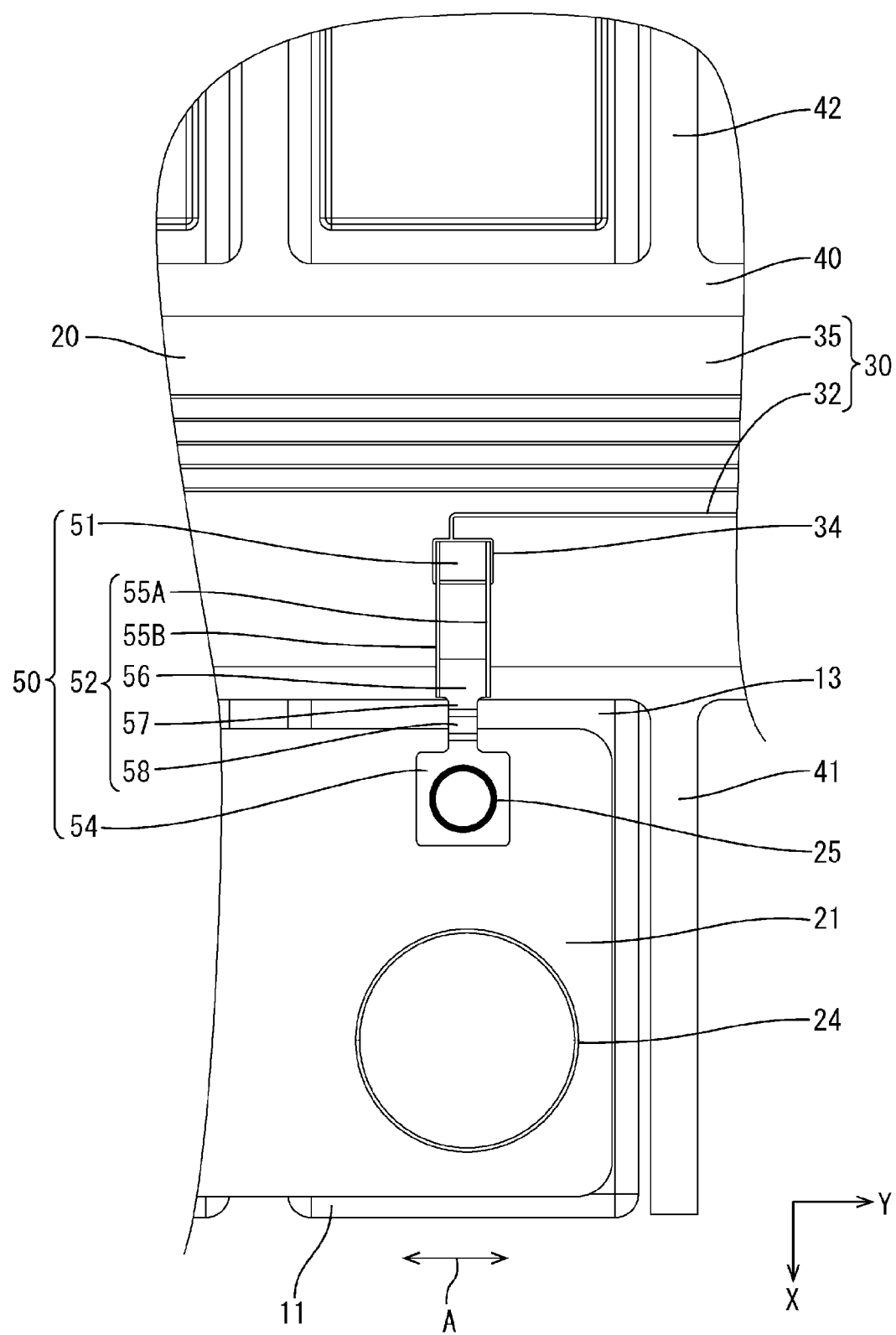
FIG. 3 is an enlarged plan view of a portion of the connection structure of a circuit board, a relay member, and a bus bar.
Figure 4:
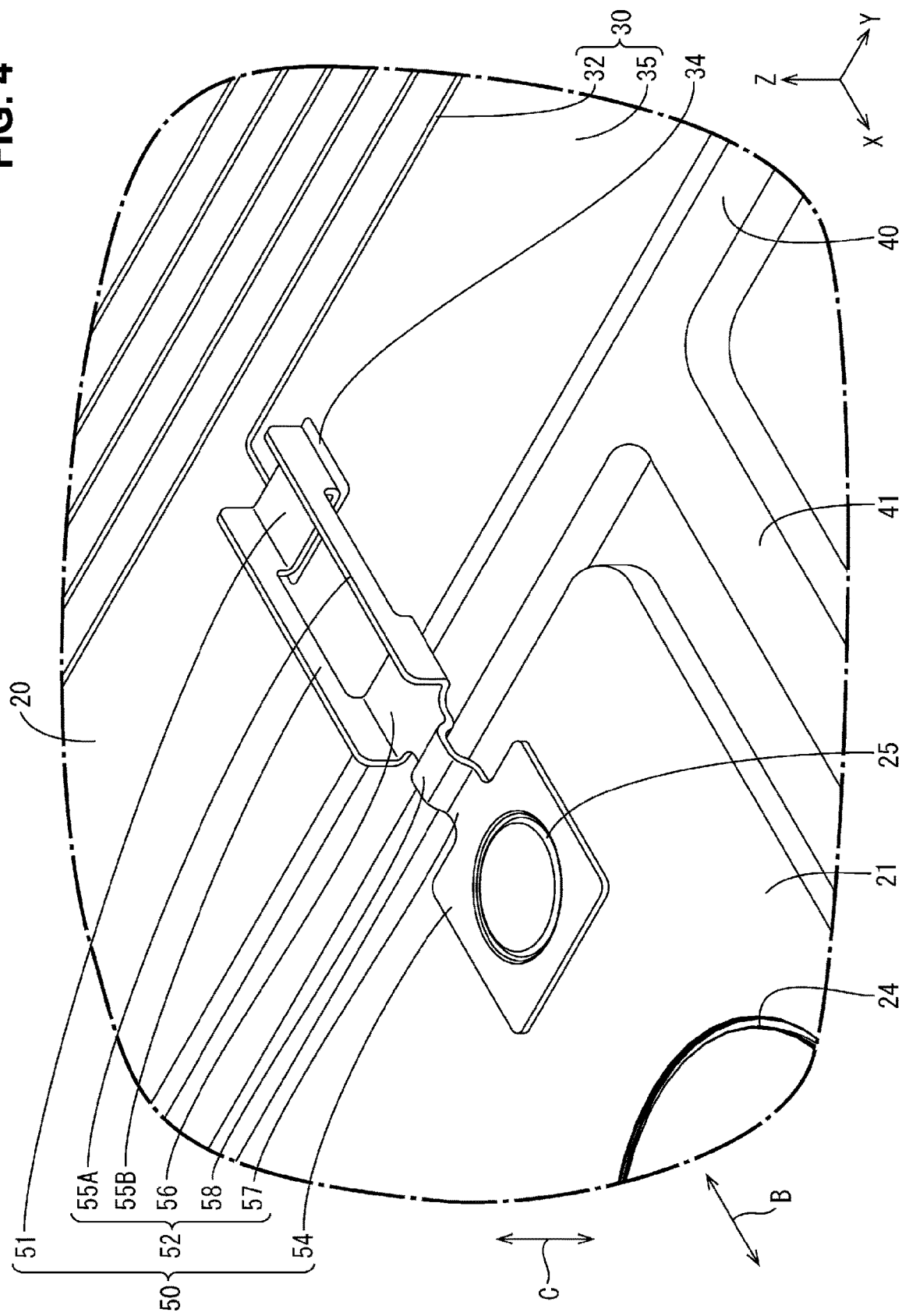
FIG. 4 is an enlarged perspective view of a portion of the connection structure of the circuit board, the relay member, and the bus bar.

As illustrated in FIGS. 3 and 4, a relay member 50 is formed by pressing a metal plate material into a predetermined shape. The metal constituting the relay member 50 may be a discretionary metal selected according to the needs, such as copper, a copper alloy, aluminum, an aluminum alloy, nickel, a nickel alloy, or the like. In the present embodiment, the relay member 50 is made of nickel or a nickel alloy and includes nickel.

A plating layer made of metal may be formed on the surface of the relay member 50. The metal constituting the plating layer may be a discretionary metal selected according to the needs, such as tin, solder, nickel, or the like.

The relay member 50 includes a bus bar connection portion 54 that connects with the bus bar 21, a board connection portion 51 that connects with the land 34 of the circuit board 30, and a connection portion 52 that joins the bus bar connection portion 54 and the board connection portion 51.

Figure 5:
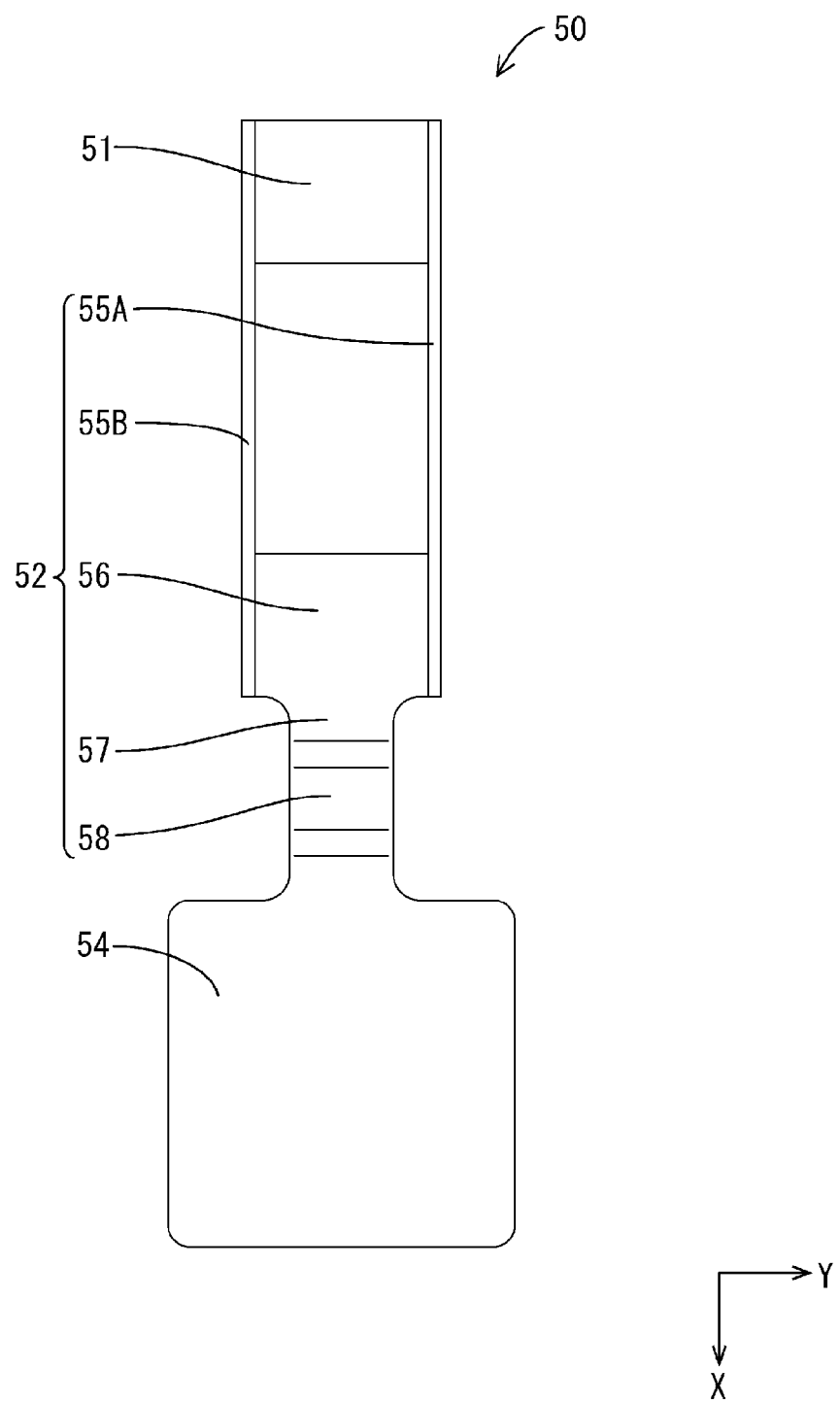
FIG. 5 is a plan view illustrating the relay member.

As illustrated in FIG. 5, the bus bar connection portion 54 according to the present embodiment has a substantially quadrangular shape as seen from above. The shape of the bus bar connection portion 54 is not limited and may be a discretionary shape, such as a circular or elliptical shape. The bus bar connection portion 54 and the bus bar are connected via a known method, such as soldering or welding. In the present embodiment, the bus bar connection portion 54 and the bus bar are welded together via laser welding. A weld mark 25 with a circular shape as seen from above is formed via laser welding on the bus bar connection portion 54 (see FIG. 3). The shape of the weld mark 25 is not limited and may be linear.

As illustrated in FIGS. 3 and 4, the board connection portion 51 according to the present embodiment has a substantially quadrangular shape as seen from above and is formed slightly smaller than the land 34. The board connection portion 51 and the land 34 are connected via soldering.

As illustrated in FIG. 5, the bus bar connection portion 54 and the board connection portion 51 are joined via the connection portion 52. The connection portion 52 is formed extending in a direction (left-and-right direction) intersecting the arrangement direction (front-and-back direction) of the plurality of power storage elements 11.

As illustrated in FIG. 5, the connection portion 52 includes a front first deformation portion 55A (an example of a first deformation portion) extending right from the front edge of the bus bar connection portion 51, a back first deformation portion 55B (an example of a first deformation portion) extending right from the back edge of the bus bar connection portion 51, an intermediate plate portion 56 joining the right end portion of the front first deformation portion 55A and the right end portion of the back first deformation portion 55B, and a second deformation portion 57 joining the intermediate plate portion 56 and the board connection portion 54.

As illustrated in FIG. 3, the plate surface of the front first deformation portion 55A and the plate surface of the back first deformation portion 55B intersect that front-and-back direction. In the left-and-right direction, the length dimension of the front first deformation portion 55A and the length dimension of the back first deformation portion 55B are set equal. In the vertical direction, the height dimension of the front first deformation portion 55A and the height dimension of the back first deformation portion 55B are set equal. The front first deformation portion 55A and the back first deformation portion 55B are capable of bending and deforming in the front-and-back direction indicated by arrow A in FIG. 3.

The intermediate plate portion 56 joins together the lower edge of the right end portion of the front first deformation portion 55A and the lower edge of the right end portion of the back first deformation portion 55B. The intermediate plate portion 56 has a substantially quadrangular shape as seen from above. The shape of the intermediate plate portion 56 may be set to roughly the same shape as the bus bar connection portion 54.

Figure 6:
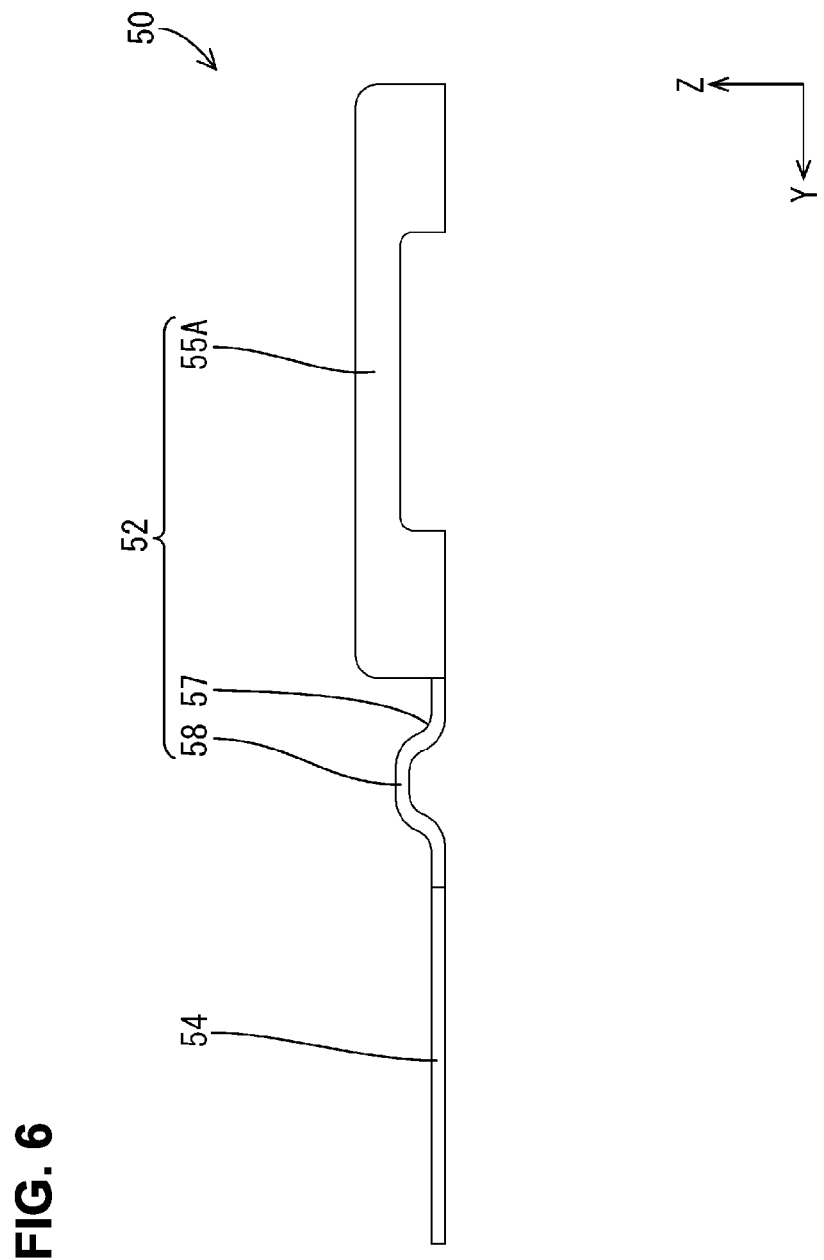
FIG. 6 is a side view illustrating the relay member.
Figure 7:
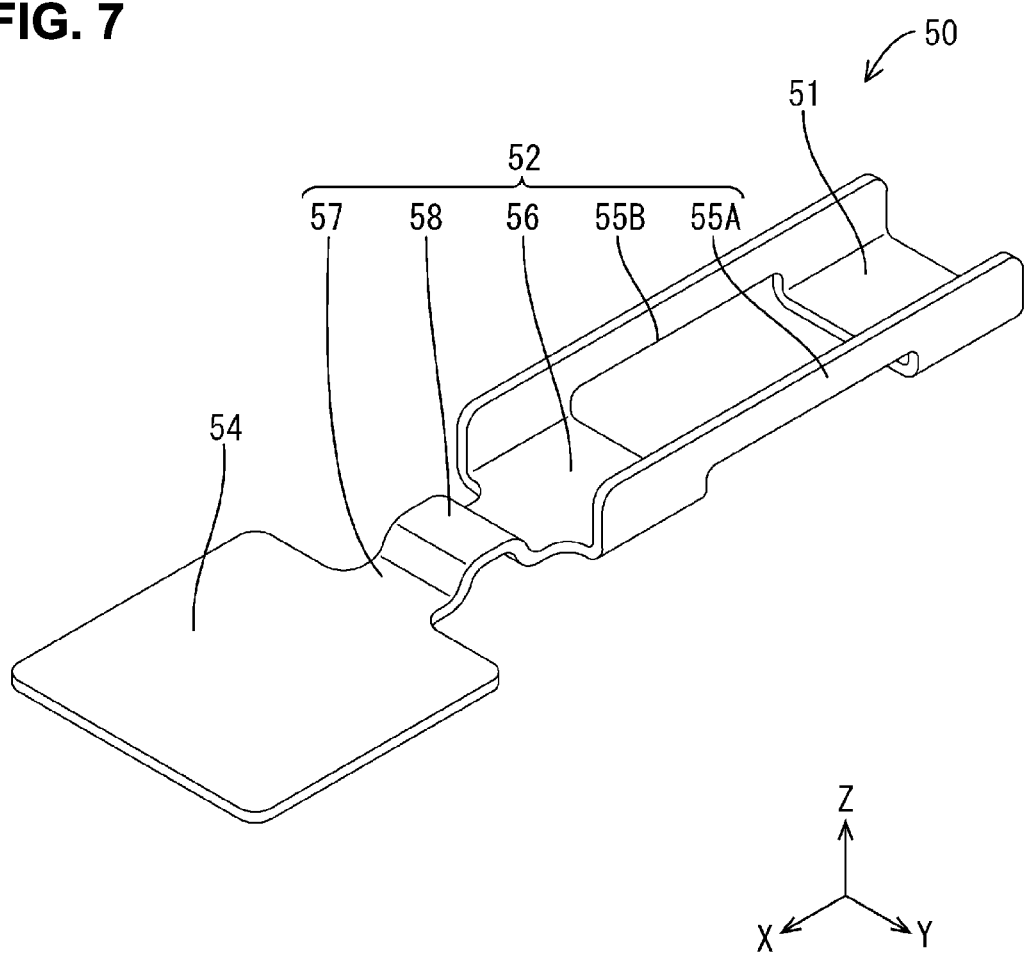
FIG. 7 is a perspective view illustrating the relay member.

The second deformation portion 57 joining the intermediate plate portion 56 and the bus bar connection portion 54 is formed extending in the left-and-right direction (a direction intersecting the arrangement direction of the plurality of power storage elements 11). As illustrated in FIGS. 6 and 7, the second deformation portion 57 includes a second bend portion 58 that bends outward upward. Because the second bend portion 58 is provided, the second deformation portion 57 can deform in the left-and-right direction (an example of a direction intersecting the arrangement direction) and the vertical direction (an example of a direction intersecting the arrangement direction). Note that the projection direction of the second bend portion 58 is not limited, and the second bend portion 58 may bend outward downward.

In the front-and-back direction, the width dimension of the second deformation portion 57 is set smaller than the width dimension of the intermediate plate portion 56 and the width dimension of the bus bar connection portion 54. In this manner, the second deformation portion 57 relatively easily deforms.

Manufacturing Process of Embodiment

Next, an example of the process of manufacturing the power storage module 10 and the wiring module 20 according to the present embodiment will be described. The process of manufacturing the power storage module 10 and the wiring module 20 is not limited by the following.

The conductive path 32 is formed on the circuit board 30 via printed circuit technology. The reinforcement plate 40 is bonded to the lower surface of the circuit board 30.

The board connection portion 51 of the relay member 50 is placed on the land 34 of the circuit board 30 and soldered to the land 34. The board connection portion 51 and the land 34 may be connected via a known reflow soldering method or may be connected via soldering using a tool such as a soldering iron.

The plurality of bus bars 21 are arranged in the front-and-back direction to the side of the circuit board 30. The bus bar connection portion 54 of the relay member 50 is placed on each one of the bus bars 21. The bus bar connection portions 54 and the bus bars 21 are laser welded together. In this manner, the wiring module 20 is completed.

The wiring module 20 is placed on the upper surface of the power storage element group 12 formed by arranging the plurality of power storage elements 11 in the front-and-back direction. The bus bars 21 and the electrode terminals 13 of the power storage elements 11 are laser welded together. In this manner, the power storage module 10 is completed.

Advantageous Effects of Present Embodiment

Next, the operation and effects of the present embodiment will be described. The wiring module 20 according to the present embodiment is configured to attach to the power storage element group 12 of the arranged plurality of power storage elements 11, each one of the power storage elements 11 including the electrode terminal 13 and includes the bus bar 21 that connects to the electrode terminal 13; the circuit board 30 on which the conductive path 32 is formed; and the relay member 50 that connects the bus bar 21 and the circuit board 30, wherein the relay member 50 includes the bus bar connection portion 54 that connects to the bus bar 21 and the board connection portion 51 that connects to the land 34 formed on the conductive path 32 of the circuit board 30, the relay member 50 includes the connection portion 52 with a plate-like shape that joins the bus bar connection portion 54 and the board connection portion 51 and extends in the left-and-right direction (a direction intersecting the arrangement direction of the plurality of power storage elements 11), and the connection portion 52 includes the front first deformation portion 55A and the back first deformation portion 55B capable of deforming in the left-and-right direction, and the plate surface of the front first deformation portion 55A and the back first deformation portion 55B intersects the arrangement direction.

Also, the power storage module 10 according to the present embodiment includes the wiring module 20; and a power storage element group 12 of the arranged plurality of power storage elements 11, each one of the plurality of power storage elements 11 including the electrode terminal 13, wherein the land 34 of the conductive path 32 and the board connection portion 51 are soldered together, and the electrode terminal 13 and the bus bar connection portion 54 are welded together.

According to the present embodiment, in a case where the bus bar 21 connected to the electrode terminal 13 of the power storage elements 11 and the land 34 of the circuit board 30 are misaligned in the front-and-back direction (the arrangement direction of the plurality of power storage elements 11) indicated by arrow A in FIG. 3, the front first deformation portion 55A and the back first deformation portion 55B deform in the front-and-back direction, thus minimizing or preventing a load acting on the connection portion between the bus bar 21 and the bus bar connection portion 54 and the connection portion between the land 34 and the board connection portion 51. In this manner, the electrical connection reliability between the bus bars 21 and the circuit board 30 can be enhanced.

An example of a cause of misalignment in the arrangement direction (front-and-back direction) of the plurality of power storage elements 11 between the bus bars 21 connected to the electrode terminals 13 of the power storage elements 11 and the lands 34 of the circuit board 30 includes, for example, the power storage elements 11 expanding or contracting when charging or discharging. Another example includes the manufacturing tolerance and the assembly tolerance of the power storage elements 11 accumulating as the plurality of power storage elements 11 are arranged. Yet another example includes vibrations caused upon installation in a vehicle causing misalignment. Note that the cause for misalignment is not limited to those listed above.

In a case where a relatively easy-to-deform portion, such as the front first deformation portion 55A and the back first deformation portion 55B, is formed in the connection portion 52, the strength of the connection portion 52 may be reduced. This may lead to the connection portion 52 deforming at an unexpected time or in an unexpected direction as a result of a collision with a foreign object, for example. In light of this, the present embodiment has a configuration in which the plate surfaces of the front first deformation portion 55A and the back first deformation portion 55B intersect the front-and-back direction. In this manner, the front first deformation portion 55A and the back first deformation portion 55B are resistant to deformation in a direction (the left-and-right direction and the vertical direction) intersecting the arrangement direction of the plurality of power storage elements 11. This minimizes or prevents unexpected deformation in the connection portion 52.

Also, according to the present embodiment, the connection portion 52 includes the front first deformation portion 55A and the back first deformation portion 55B. By the connection portion 52 including two first deformation portions, i.e., the front first deformation portion 55A and the back first deformation portion 55B, in this manner, the strength of the connection portion 52 can be enhanced compared to a configuration in which the connection portion 52 includes a single first deformation portion. As a result, adjustment of how easily the first deformation portion deforms and the strength can be easily performed by adjusting the number of the first deformation portions formed in the connection portion 52.

Also, according to the present embodiment, the connection portion 52 further includes the second deformation portion 57 capable of deformation in a direction (the vertical direction and the left-and-right direction) intersecting the arrangement direction of the plurality of power storage elements 11.

In a case where the second deformation portion 57 deforms in a direction intersecting the arrangement direction of the plurality of power storage elements 11, misaligning the bus bar 21 connected to the electrode terminal 13 of the power storage element 11 and the land 34 of the circuit board 30 in the left-and-right direction indicated by arrow B in FIG. 4 and the vertical direction indicated by arrow C in FIG. 4 (a direction intersecting the arrangement direction of the plurality of power storage elements 11), a load acting on the connection portion between the bus bar 21 and the bus bar connection portion 54 and the connection portion between the land 34 and the board connection portion 51 is minimized or prevented. In this manner, the electrical connection reliability between the bus bars 21 and the circuit board 30 can be enhanced.

According to the present embodiment, the second bend portion 58 is formed at the second deformation portion 57, the second bend portion 58 bending outward in a direction (upward) intersecting the plate surface of the second deformation portion 57.

According to the present embodiment, by forming the second bend portion 58 at the second deformation portion 57, the second deformation portion 57 easily deforms at the second bend portion 58. Thus, in a case where the bus bar 21 connected to the electrode terminal 13 of the power storage element 11 and the land 34 of the circuit board 30 are misaligned in a direction (the vertical direction and the left-and-right direction) intersecting the arrangement direction of the plurality of power storage elements 11, the second deformation portion 57 can easily deform. Accordingly, a load acting on the connection portion between the bus bar 21 and the bus bar connection portion 54 and a connection portion between the land 34 and the board connection portion 51 can be minimized or prevented. This allows the electrical connection reliability between the bus bars 21 and the circuit board 30 to be further enhanced.

According to the present embodiment, the bus bars 21 are made of aluminum or an aluminum alloy, the relay members 50 are made of nickel or a nickel alloy, and the bus bars 21 and the relay members 50 are welded together.

In a case where the bus bars 21 are formed by aluminum or an aluminum alloy, depending on the material of the relay members 50, welding together the bus bars 21 and the relay members 50 may form a relatively brittle alloy at the interface portion between the bus bars 21 and the relay members 50. According to the present embodiment, the relay members 50 are made of nickel or a nickel alloy, and the bus bars 21 are made of aluminum or an aluminum alloy. Thus, a highly stable alloy is formed between the bus bar connection portion 54 of the relay member 50 and the bus bar 21, allowing the bus bar 21 and the relay member 50 to be strongly welded together.

According to the present embodiment, the circuit board 30 is a flexible printed circuit. Accordingly, the wiring density can be enhanced compared to a configuration in which a circuit for detecting the voltage of the power storage elements 11 are formed by a plurality of electrical wires, allowing the size of the wiring module 20 to be reduced.

The wiring module 20 according to the present embodiment is for a vehicle and is used installed in the vehicle 1. Even when vibrations from the vehicle 1 travel to the wiring module 20, the electrical connection reliability between the bus bars and the circuit board can be enhanced. Thus, the wiring module 20 according to the present embodiment can be suitably used in the vehicle 1, which experiences vibration when running.

Second Embodiment

Figure 8:
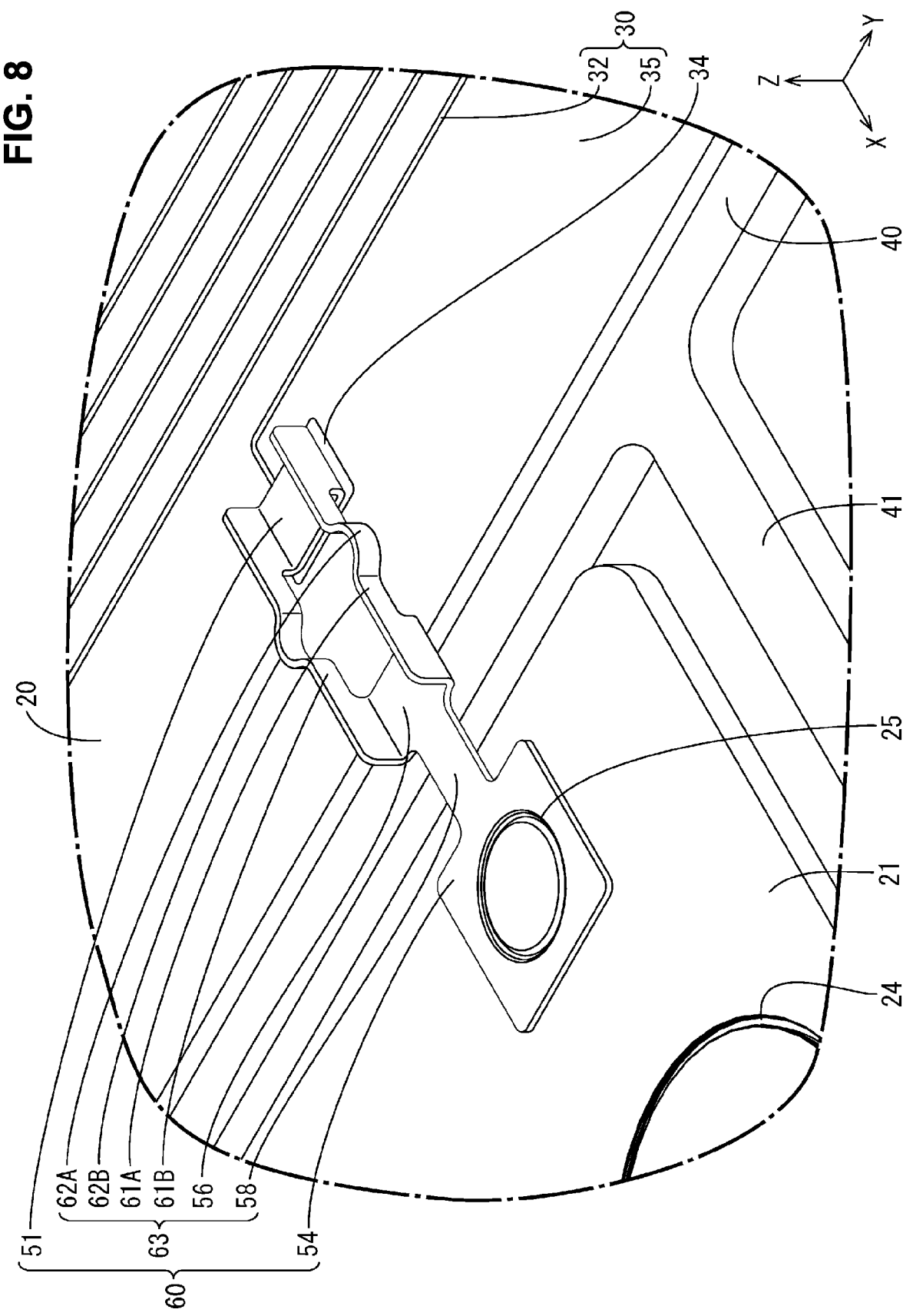
FIG. 8 is an enlarged perspective view of a portion of the connection structure of a circuit board, a relay member, and a bus bar of a power storage module according to a second embodiment.
Figure 9:
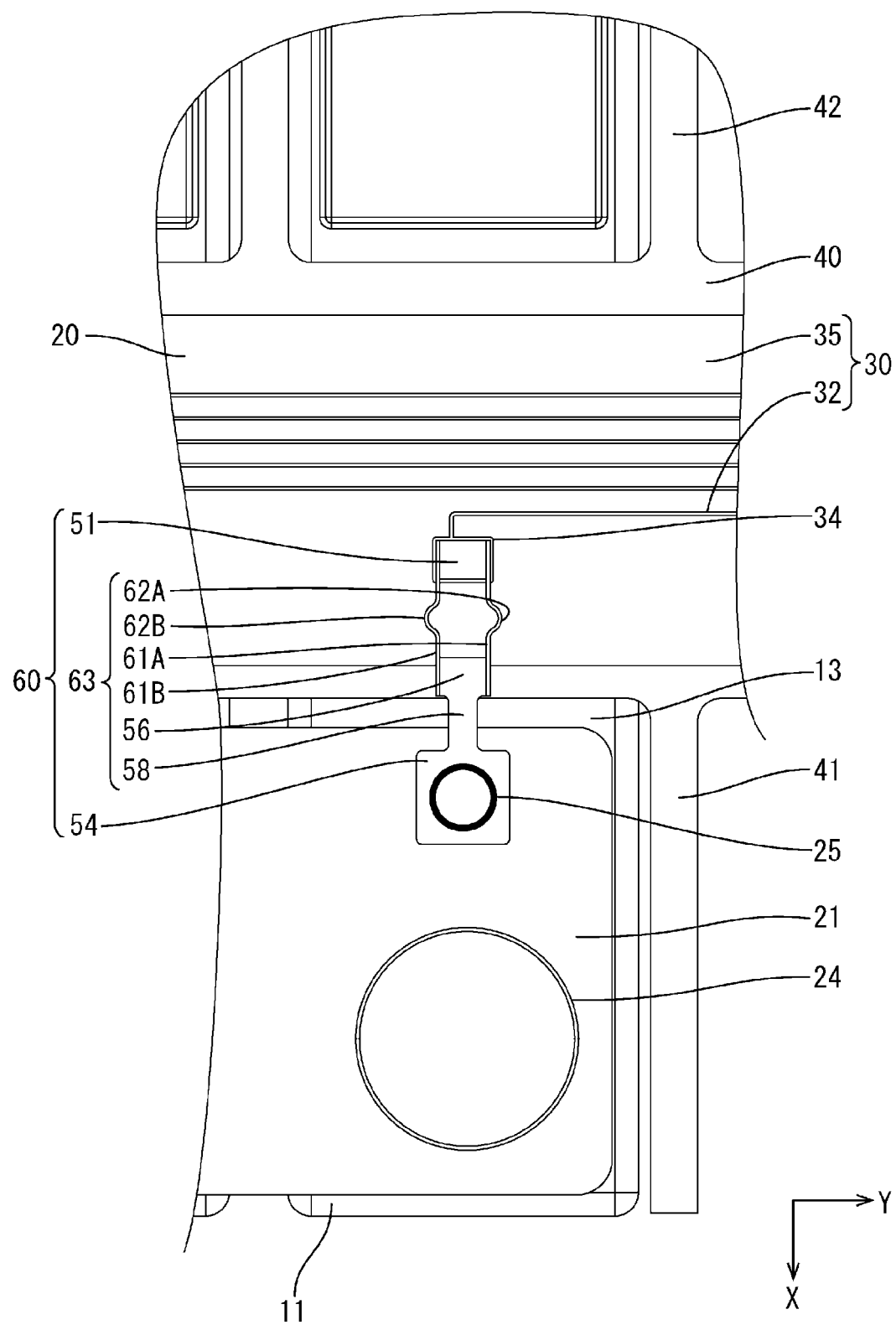
FIG. 9 is an enlarged plan view of a portion of the connection structure of the circuit board, the relay member, and the bus bar.

Next, the second embodiment of the present disclosure will be described with reference to FIGS. 8 and 9. FIGS. 8 and 9 are diagrams illustrating a relay member 60 according to the present embodiment. The relay member 60 includes a connection portion 63. A front first bend portion 62A that bends outward to the front is formed at a front first deformation portion 61A in a central region in the left-and-right direction. A back first bend portion 62B that bends outward to the back is formed at a back first deformation portion 61B in a central region in the left-and-right direction at a position corresponding to the front first bend portion 62A. The front first bend portion 62A and the back first bend portion 62B are formed in a substantially semicircular arc-shape as seen from above. In the present embodiment, a second bend portion is not formed in the second deformation portion 57.

Components other than those described above are substantially similar to those of the first embodiment, and thus similar components are given the same reference sign or number and redundant description will be omitted.

According to the present embodiment, by forming the front first bend portion 62A at the front first deformation portion 55A, the front first deformation portion 55A easily deforms at the front first bend portion 62A. In a similar manner, by forming the back first bend portion 62B at the back first deformation portion 55B, the back first deformation portion 55B easily deforms at the back first bend portion 62B. Thus, in a case where the bus bar 21 connected to the electrode terminal 13 of the power storage element 11 and the land 34 of the circuit board 30 are misaligned in the arrangement direction (the front-and-back direction) of the plurality of power storage elements 11, the front first deformation portion 55A and the back first deformation portion 55B can easily deform. Accordingly, a load acting on the connection portion between the bus bar 21 and the bus bar connection portion 54 and a connection portion between the land 34 and the board connection portion 51 can be minimized or prevented. This allows the electrical connection reliability between the bus bars 21 and the circuit board 30 to be further enhanced.

Third Embodiment

Figure 10:
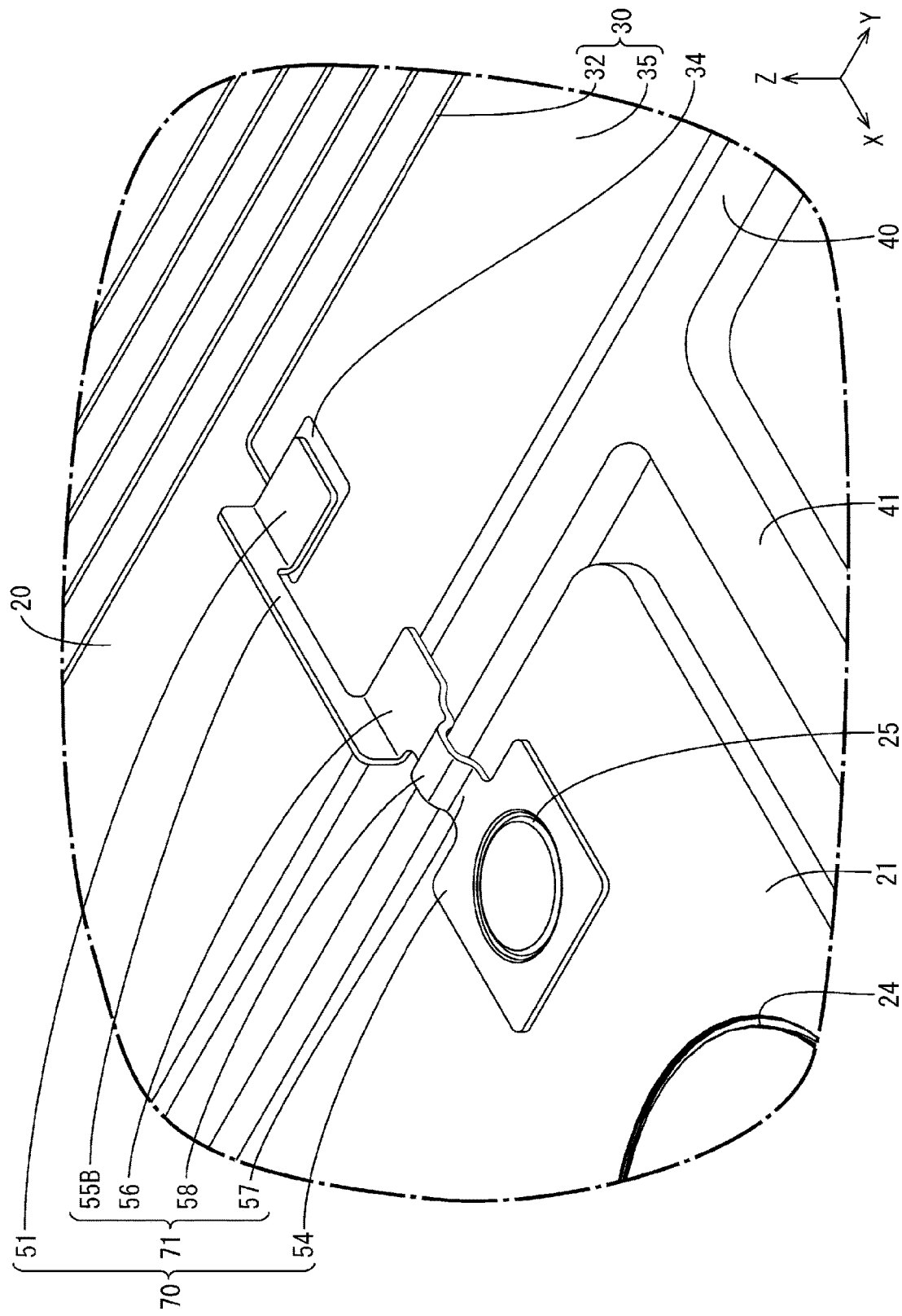
FIG. 10 is an enlarged perspective view of a portion of the connection structure of a circuit board, a relay member, and a bus bar of a power storage module according to a third embodiment.
Figure 11:
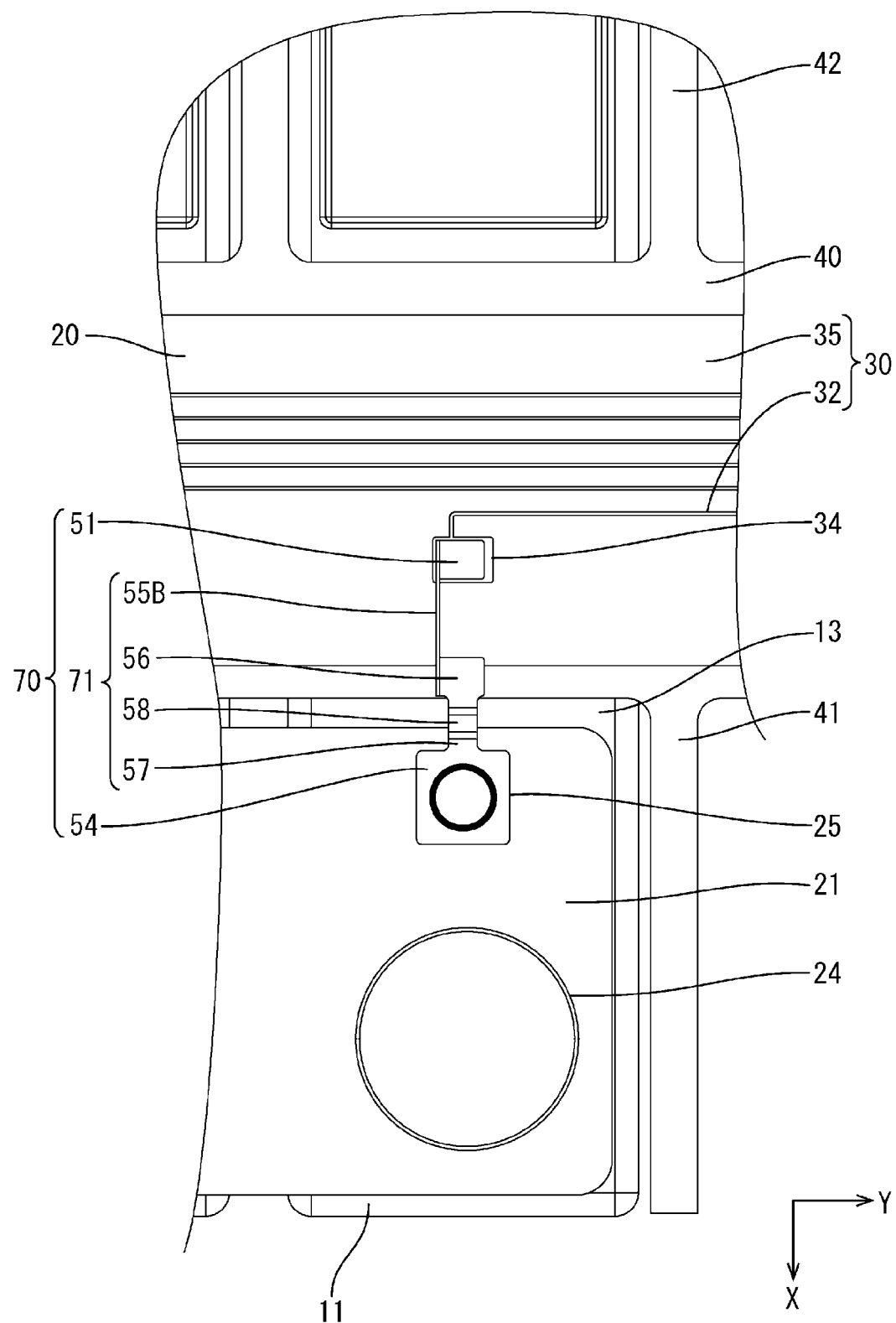
FIG. 11 is an enlarged plan view of a portion of the connection structure of the circuit board, the relay member, and the bus bar.

Next, the third embodiment of the present disclosure will be described with reference to FIGS. 10 and 11. FIGS. 10 and 11 are diagrams illustrating a relay member 70 according to the present embodiment. The relay member 70 includes a connection portion 71. The connection portion 71 includes the back first deformation portion 55B extending right from the back edge of the board connection portion 51. The relay member 70 according to the present embodiment is different from that of the first embodiment in that the front first deformation portion is not provided. Components other than those described above are substantially similar to those of the first embodiment, and thus similar components are given the same reference sign or number and redundant description will be omitted.

According to the present embodiment, because the relay member 70 is provided with the single back first deformation portion 55B, weight of the relay member 70 can be reduced compared to a configuration in which a plurality of first deformation portions are provided. This allows the wiring module 20 to be made lightweight overall.

Other Embodiments

1. The second deformation portion 57 may be omitted.
2. Three or more first deformation portions may be formed in a single relay member.
3. The electrode terminal 13 and the bus bar 21 may be bolted together.
4. The conductive path 32 may be made of a copper foil, the bus bar 21 may be made of copper or a copper alloy, and the relay member may be made of copper or a copper alloy.
5. The circuit board may be a printed circuit board with a conductive path formed on a substrate with insulating properties via printed circuit technology. Also, the circuit board may be formed by adhering a conductive path on a base sheet with insulating properties via a metal foil, i.e., a flexible flat cable.
6. The power storage elements 11 may be capacitors and not rechargeable batteries.
7. The bus bar 21 may be formed by a plating layer made of nickel or a nickel alloy being formed on the surface of aluminum or an aluminum alloy.
8. In the first embodiment, the relay member 50 is made of nickel or a nickel alloy. However, no such limitation is intended, and the metal surface of the relay member 50 may be plated with nickel or tin. The metal material obtained by plating the copper or aluminum metal surface with nickel or tin has good wettability with the solder in a molten state, allowing a strong connection to be formed between the land 34 of the circuit board 30 and the board connection portion 51 of the relay member 50.
9. The bus bar 21 may connect to one or three or more electrode terminals 13.
10. The power storage elements 11 may be rechargeable batteries and may be capacitors.
11. In the second embodiment, the front first bend portion 62A and the back first bend portion 62B are formed in a substantially semicircular arc-shape as seen from above. However, no such limitation is intended, and they may be formed in a shape with straight lines that bend as seen from above.
12. In the second embodiment, the front first bend portion 62A is formed bending outward and to the front, and the back first bend portion 62B is formed bending outward and to the back. However, no such limitation is intended. The front first bend portion may be formed bending inward to the front, and the back first bend portion may be formed bending inward to the back. Also, the front first bend portion and the back first bend portion may both be formed bending outward to the front, or the front first bend portion and the back first bend portion may both bend inward to the front.

LIST OF REFERENCE NUMERALS

1 Vehicle
2 Power storage pack
3 PCU
4 Wire harness

10 Power storage module
11 Power storage element
12 Power storage element group
13 Electrode terminal
20 Wiring module
21 Bus bar
24 Weld mark
25 Weld mark
30 Circuit board
32 Conductive path
34 Land
35 Support substrate
40 Reinforcement plate
41 Spaced portion
42 Projection portion
50, 60, 70 Relay member
51 Board connection portion
52, 63, 71 Connection portion
54 Bus bar connection portion
55A, 61A Front first deformation portion
55B, 61B Back first deformation portion
56 Intermediate plate portion
57 Second deformation portion
58 Second bend portion
62A Front first bend portion
62B Back first bend portion

The invention claimed is:

1. A wiring module configured to attach to a power storage element group of an arranged plurality of power storage elements, each one of the power storage elements including an electrode terminal, comprising:
   a bus bar that connects to the electrode terminal;
   a circuit board on which a conductive path is formed; and
   a relay member that connects the bus bar and the circuit board, wherein
   the relay member includes a bus bar connection portion that connects to the bus bar and a board connection portion that connects to the conductive path of the circuit board,
   the relay member includes a connection portion with a plate-like shape that joins the bus bar connection portion and the board connection portion and extends in a direction intersecting an arrangement direction of the plurality of power storage elements,
   the connection portion includes a first deformation portion capable of deforming in the arrangement direction, and a plate surface of the first deformation portion intersects the arrangement direction, and
   the first deformation portion extends from a surface of the board connection portion that is opposite to a surface of the board connection portion that connects to the conductive path of the circuit board.

2. The wiring module according to claim 1, wherein the connection portion includes a plurality of the first deformation portions.

3. The wiring module according to claim 1, wherein a first bend portion is formed at the first deformation portion, the first bend portion bending outward or inward in a direction intersecting the plate surface of the first deformation portion.

4. The wiring module according to claim 1, wherein the connection portion further includes a second deformation portion capable of deforming in a direction intersecting the arrangement direction.

5. The wiring module according to claim 4, wherein a second bend portion is formed at the second deformation portion, the second bend portion bending outward or inward in a direction intersecting a plate surface of the second deformation portion.

6. The wiring module according to claim 1, wherein the bus bar includes aluminum, the relay member includes nickel, and the bus bar and the relay member are welded together.

7. The wiring module according to claim 1, wherein the conductive path includes copper, the relay member includes a metal surface plated with nickel or tin, and the conductive path and the relay member are soldered together.

8. The wiring module according to claim 1, wherein the circuit board is a flexible printed circuit.

9. The wiring module according to claim 1, wherein the wiring module is for a vehicle and is used installed in a vehicle.

10. A power storage module, comprising:
    the wiring module according to claim 1; and
    a power storage element group of an arranged plurality of power storage elements, each one of the plurality of power storage elements including an electrode terminal, wherein
    the conductive path and the board connection portion are soldered together, and the electrode terminal and the bus bar connection portion are welded together.

* * * * *